(12) United States Patent
Lee

(10) Patent No.: US 9,478,590 B2
(45) Date of Patent: *Oct. 25, 2016

(54) IN-CELL OLED TOUCH DISPLAY PANEL STRUCTURE WITH METAL LAYER FOR SENSING

(71) Applicant: SuperC-Touch Corporation, New Taipei (TW)

(72) Inventor: Hsiang-Yu Lee, New Taipei (TW)

(73) Assignee: SUPERC-TOUCH CORPORATION, New Taipei (TW)

( * ) Notice: Subject to any disclaimer, the term of this patent is extended or adjusted under 35 U.S.C. 154(b) by 21 days.

This patent is subject to a terminal disclaimer.

(21) Appl. No.: 14/457,838

(22) Filed: Aug. 12, 2014

(65) Prior Publication Data

US 2014/0353691 A1 Dec. 4, 2014

Related U.S. Application Data

(63) Continuation-in-part of application No. 13/891,897, filed on May 10, 2013, now abandoned.

(30) Foreign Application Priority Data

May 22, 2012 (TW) .............................. 101209658 U
Aug. 13, 2013 (TW) .............................. 102215173 U

(51) Int. Cl.
*G06F 3/041* (2006.01)
*H01L 27/32* (2006.01)
*G06F 3/044* (2006.01)

(52) U.S. Cl.
CPC ............. *H01L 27/323* (2013.01); *G06F 3/044* (2013.01); *G06F 3/0412* (2013.01); *H01L 27/3272* (2013.01); *H01L 27/3276* (2013.01); *G06F 2203/04103* (2013.01)

(58) Field of Classification Search
CPC ..................................................... H01L 27/323
USPC ......................................................... 313/500
See application file for complete search history.

(56) References Cited

U.S. PATENT DOCUMENTS

2009/0322702 A1* 12/2009 Chien ..................... G06F 3/044
  345/174
2012/0162584 A1* 6/2012 Chang .................. G06F 3/0412
  349/106

(Continued)

FOREIGN PATENT DOCUMENTS

TW          M445719         1/2013

*Primary Examiner* — Jason Olson
(74) *Attorney, Agent, or Firm* — Muncy, Geissler, Olds & Lowe, P.C.

(57) ABSTRACT

An in-cell OLED touch display panel structure with metal layer for sensing includes an upper substrate, a lower substrate parallel to the upper substrate, an OLED layer configured between the upper and lower substrates, a black matrix layer, a sensing electrode layer, and a thin film transistor layer. The black matrix layer is disposed at one surface of the upper substrate facing the OLED layer, and is composed of a plurality of opaque lines. The sensing electrode layer is disposed at one side of the black matrix layer facing the OLED layer, and is composed of a plurality of sensing conductor lines. The thin film transistor layer is disposed at one side of the lower substrate facing the OLED layer. The plurality of sensing conductor lines are disposed at positions corresponding to those of the plurality of opaque lines of the black matrix.

11 Claims, 6 Drawing Sheets

(56) References Cited

U.S. PATENT DOCUMENTS

| | | | |
|---|---|---|---|
| 2013/0242211 A1* | 9/2013 | Lee | G06F 3/0412 349/12 |
| 2013/0314371 A1* | 11/2013 | Lee | G06F 3/0412 345/174 |
| 2014/0078104 A1* | 3/2014 | Lee | G06F 3/044 345/174 |
| 2014/0375911 A1* | 12/2014 | Lee | G06F 3/0412 349/12 |
| 2015/0009426 A1* | 1/2015 | Lee | G02F 1/13338 349/12 |
| 2015/0042612 A1* | 2/2015 | Lee | G02F 1/13338 345/174 |
| 2015/0048346 A1* | 2/2015 | Lee | H01L 27/323 257/40 |

* cited by examiner

IN-CELL OLED TOUCH DISPLAY PANEL STRUCTURE WITH METAL LAYER FOR SENSING

CROSS REFERENCE TO RELATED APPLICATION

This application claims the benefits of the Taiwan Patent Application Serial Number 102215173, filed on Aug. 13, 2013, the subject matter of which is incorporated herein by reference.

This application is a continuation-in-part (CIP) of U.S. Patent application for an "in-cell touch display panel structure with metal layer for sensing", U.S. application Ser. No. 13/891,897, filed on May 10, 2013.

BACKGROUND OF THE INVENTION

1. Field of the Invention

The present invention discloses a structure of touch display panel and, more particularly, an in-cell OLED touch display panel structure with metal layer for sensing.

2. Description of Related Art

Among many types of flat panel displays, the organic light emitting diode display (OLED) technology is the one with great potential. OLED was first published by Eastman Kodak Co. in 1987. It has the features of thinness, light weight, self-illumination, low driving voltage, high efficiency, high contrast, high color saturation, fast response, flexibility, etc., and is therefore deemed as positively evaluated display technology following the TFT-LCD.

In recent years, due to the development of mobile communications, digital products and digital televisions, the demand for high-quality full-color flat-panel displays is rapidly increased. The OLED display is provided with not only the advantages of LCD display including thinness, power-saving, and full-color display, but also the features of wide viewing angle, self-illumination, and fast response that are better than LCD.

FIG. 1 schematically illustrates the basic structure of prior OLED display. The OLED display 100 includes a cathode layer 110, an OLED layer 120, an anode layer 130, a thin film transistor layer 140, a lower substrate 150, and an upper substrate 160, wherein the OLED layer 120 further includes a hole transporting layer (HTL) 121, an emitting layer 123, and an electron transporting layer (ETL) 125.

The light-emitting principle of OLED is such that the electrons and electric holes are injected from the cathode layer 110 and the anode layer 130 respectively by applying electric field and, after the electric holes pass through the electric hole transport sub-layer 121 and electrons pass through the electron transport sub-layer 125, the electrons and electric holes enter the light-emitting layer 123 with fluorescent characteristics and then are combined to produce excited photons, which immediately release energy and return to the ground state. The released energy will generate different colors of light based on different luminescent materials, so as to cause OLED to emit light.

The conventional touch display panel includes a touch panel and a display unit overlapped with the touch panel. The touch panel is configured as an operation interface. The touch panel is transparent so that an image generated by the display unit can be viewed directly by a user without being sheltered by the touch panel. Such well known skill of the touch panel may increase additional weight and thickness of the touch display panel, and may further reduce the light penetration rate, and increase reflectance and haze of the touch display panel, resulting in degrading the quality of display.

On-cell and in-cell touch technology are invented to overcome the drawbacks of traditional touch technology described above. The on-cell technology is to dispose a touch sensor on a thin film and then bond the thin film onto the upper one of the upper glass substrate layer. The in-cell touch technology is provided to integrate the touch sensor within the display unit so that the display unit is provided with the ability of the touch panel. Therefore, the touch display panel does not need to be bonded with an additional touch panel so as to simplify the assembly procedure. Such skill is generally developed by display panel manufactures.

For the on-cell touch technology, it needs a sensing layer to be configured on an upper glass substrate or needs to use an upper substrate to increase touch sensing electrode, which not only increases the manufacturing cost but also complicates the manufacturing process, resulting in lowering the yield rate and thus increasing the manufacturing cost. Therefore, it desired for the aforementioned OLED touch display panel structure to be improved.

SUMMARY OF THE INVENTION

The object of the present invention is to provide an in-cell OLED touch display panel structure with metal layer for sensing, which significantly increases the light penetration rate, decrease the weight and thickness of a display panel, and also greatly reduces the material and manufacturing cost.

To achieve the object, there is provided an in-cell OLED touch display panel structure with metal layer for sensing, which comprises: an upper substrate; a lower substrate parallel to the upper substrate; an OLED layer configured between the upper substrate and the lower substrate; a black matrix layer disposed at one surface of the upper substrate facing the OLED layer, the black matrix layer being composed of a plurality of opaque lines; a sensing electrode layer disposed at one side of the black matrix layer facing the OLED layer, the sensing electrode layer being composed of a plurality of sensing conductor lines; and a thin film transistor layer disposed at one side of the lower substrate facing the OLED layer, wherein the plurality of sensing conductor lines are disposed at positions corresponding to those of the plurality of opaque lines of the black matrix.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
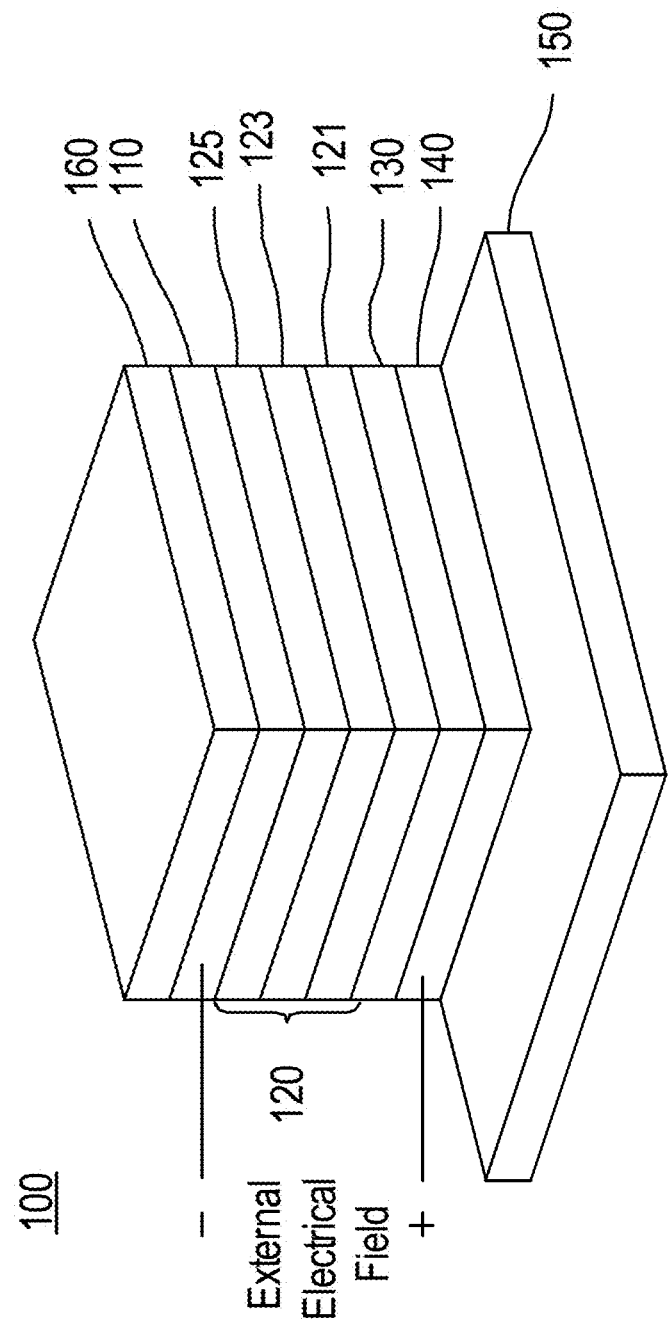
FIG. 1 schematically illustrates the basic structure of prior OLED display.
Figure 2:
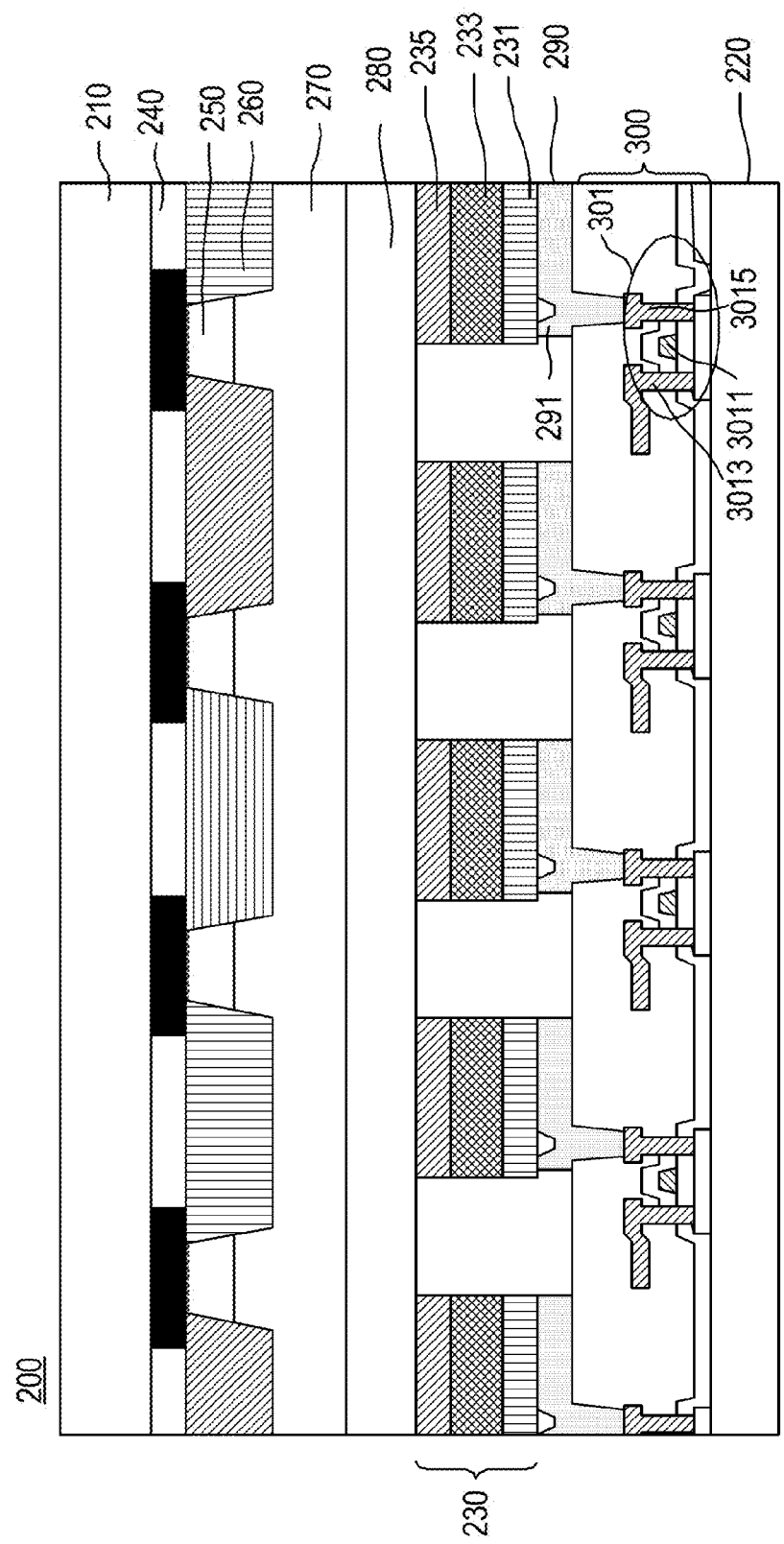
FIG. 2 shows an in-cell OLED touch display panel structure with metal layer for sensing in accordance with a preferred embodiment of the present invention.

With reference to FIG. 2, there is shown an in-cell OLED touch display panel structure with metal layer for sensing 200 in accordance with a preferred embodiment of the present invention. The in-cell touch display panel structure with metal layer for sensing 200 includes an upper substrate 210, a lower substrate 220, an OLED layer 230, a black matrix layer 240, a sensing electrode layer 250, a color filter layer 260, an over coating layer 270, a cathode layer 280, an anode layer 290, and a thin film transistor (TFT) layer 300.

The upper substrate 210 and the lower substrate 220 are preferably glass substrates and are parallel to each other. The OLED layer 230 is disposed between the upper and lower substrates 210, 220.

The black matrix layer 240 is between the upper substrate 210 and OLED layer 230 and is disposed at one surface of the upper substrate 210 that faces the OLED layer 230. The black matrix layer 240 is composed of a plurality of opaque lines.

Figure 3:
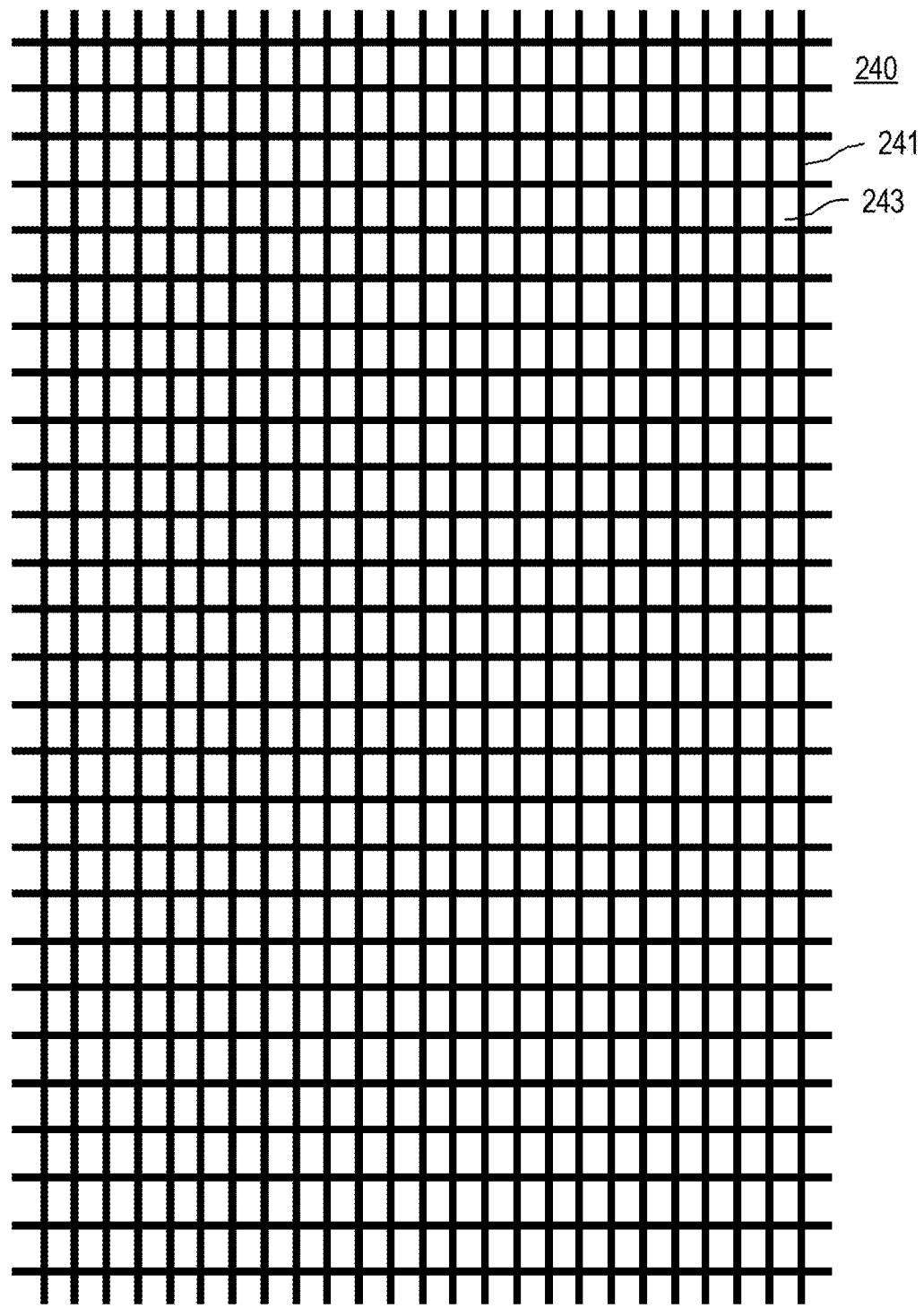
FIG. 3 shows a black matrix layer in accordance with the present invention.

FIG. 3 shows the black matrix layer 240, which is the same as that of the prior LCD panel. As shown in FIG. 3, the black matrix layer 240 is composed of a plurality of opaque lines 241 of black insulating material. The opaque lines 241 of black insulating material are arranged as a checkerboard pattern and the color filter is disposed at the spaces 243 among the lines 241 of black insulating material.

In the present invention, the sensing electrode layer 250 is arranged between the black matrix layer 240 and the color filter layer 260, and a touch sensing pattern structure is formed on the sensing electrode layer 250. Therefore, there is no need to dispose a sensing electrode layer on the upper glass substrate or lower glass substrate of the display panel, thereby saving the manufacturing cost, simplifying the assembly procedure, and further improving the panel yield.

Figure 4:
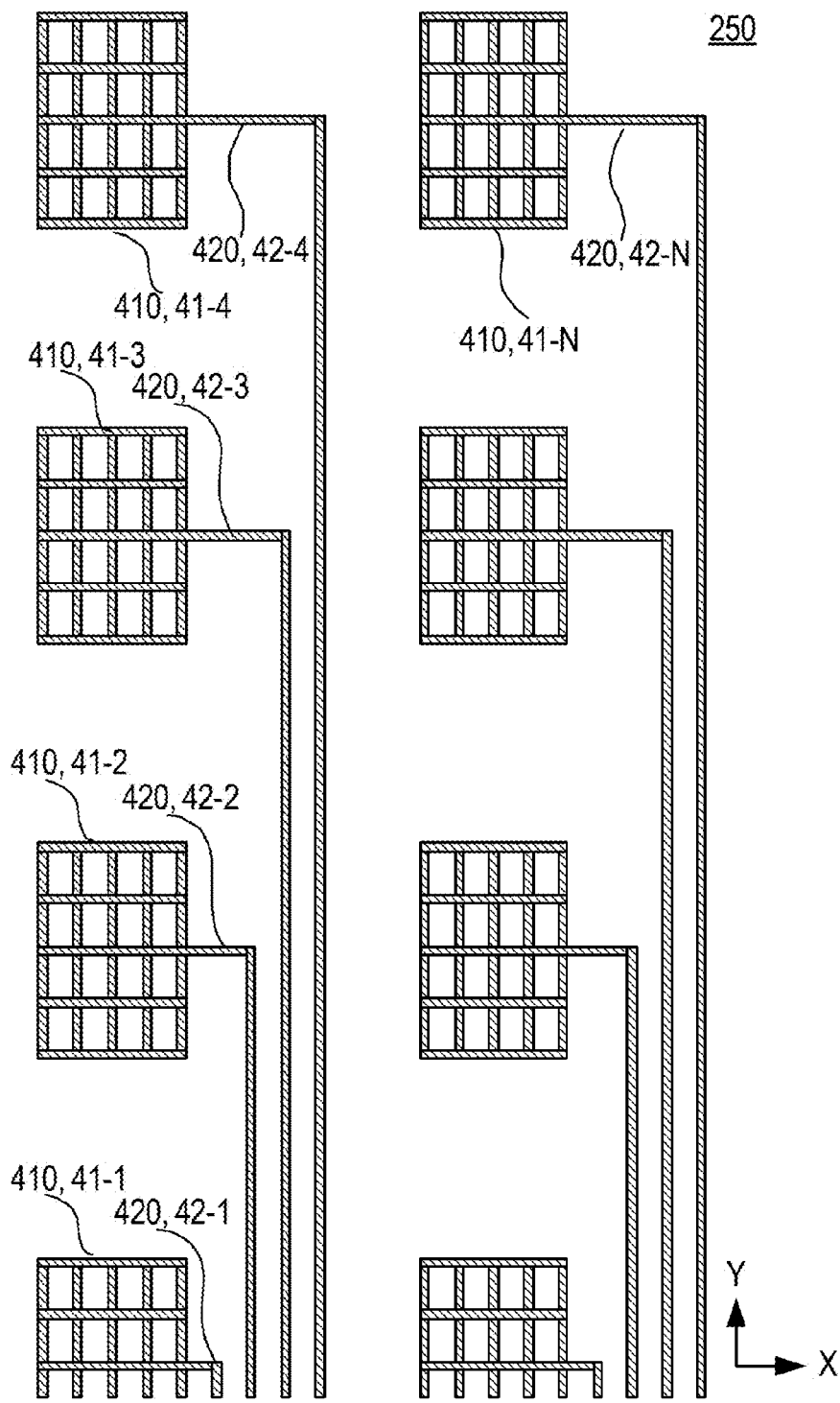
FIG. 4 is a schematic diagram of the sensing electrode layer in accordance with the present invention.

FIG. 4 is a schematic diagram of the sensing electrode layer 250 in accordance with the present invention. As shown in FIG. 4, the sensing electrode layer 250, that is disposed on one surface of the black matrix layer 240 facing the OLED layer 230, is composed of a plurality of sensing conductor lines 410, 420. The plurality of sensing conductor lines 410, 420 are disposed at positions corresponding to the positions of the plurality of opaque lines 241 of the black matrix layer 240.

As shown in FIG. 4, the plurality of sensing conductor lines 410, 420 of the sensing electrode layer 250 are arranged in a first direction (X-axis direction) and a second direction (Y-axis direction), wherein the first direction is vertical to the second direction. The plurality of sensing conductor lines 410, 420 of the sensing electrode layer 250 are made of conductive metal material, wherein the conductive metal material is selectively to be chromium, barium, aluminum, silver, copper, titanium, nickel, tantalum, cobalt, tungsten, magnesium, calcium, potassium, lithium, indium, and their alloy.

The plurality of sensing conductor lines 410, 420 are divided into a first group of sensing conductor lines 410 and a second group of sensing conductor lines 420. The first group of sensing conductor lines 410 is formed with N mesh-like polygonal regions 41-1 to 41-N, where N is a positive integer. The sensing conductor lines in any one of the mesh-like polygonal regions are electrically connected together while the sensing conductor lines in any two mesh-like polygonal regions are not electrically connected, so as to form a single-layered touch pattern on the sensing electrode layer 250.

Each of the mesh-like polygonal regions 41-1 to 41-N is formed in a triangle, rectangle, square, rhombus, pentagon, hexagon, octagon, or round shape. In this embodiment, each of the mesh-like polygonal regions 41-1 to 41-N is formed in a rectangle shape, and the plurality of sensing conductor lines 410 are disposed at positions corresponding to the positions of the plurality of opaque lines 241 of the black matrix layer 240.

The second group of sensing conductor lines 420 is formed with N conductive traces 42-1 to 42-N. Each of the N conductive traces 42-1 to 42-N is electrically connected to a corresponding mesh-like polygonal region 41-1 to 41-N, while any two conductive traces 42-1 to 42-N are not electrically connected.

Figure 5:
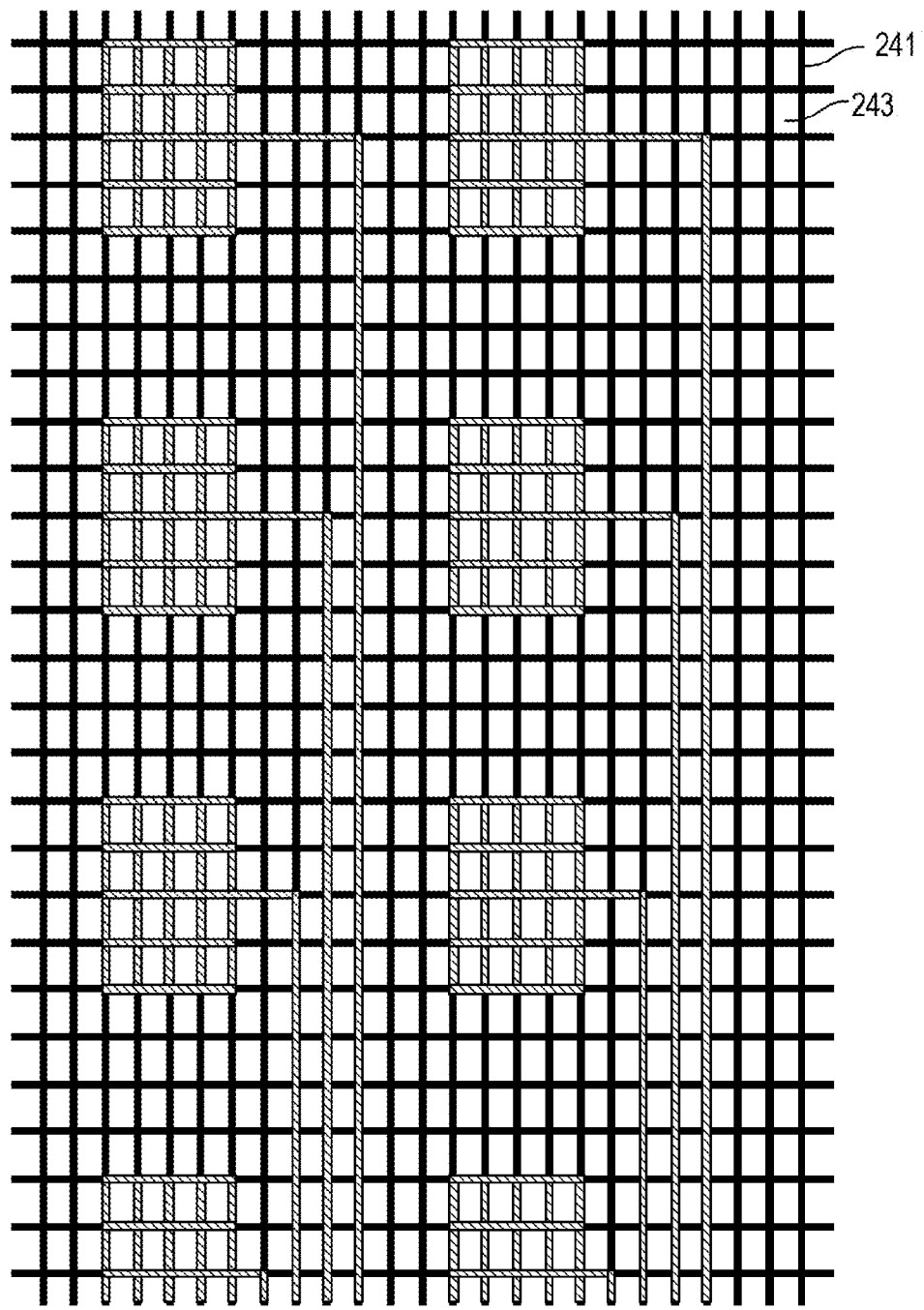
FIG. 5 is a schematic diagram of the black matrix layer and the sensing electrode layer in accordance with the present invention.

FIG. 5 is a schematic diagram of the black matrix layer 240 and the sensing electrode layer 250 in accordance with the present invention. As shown, it schematically illustrates the black matrix layer 240 overlapped with the sensing electrode layer 250, viewing from the OLED layer 230 to the first substrate 210.

The first group of sensing conductor lines 410 is correspondingly connected to the second group of sensing conductor lines 420. That is, the N mesh-like polygonal regions 41-1 to 41-N are respectively connected to the N conductive traces 42-1 to 42-N. Therefore, the first group of sensing conductor lines 410 can form a single-layered touch pattern on the sensing electrode layer 250. The line width of the first group of conductor lines 410 or the second group of conductor lines 420 is preferred to be smaller than or equal to the line width of the plurality of the opaque lines 241. When viewing from the first substrate 210 to the OLED layer 230, the first group of conductor lines 410 and the second group of conductor lines 420 can be concealed by the plurality of opaque lines 241, so that users only see the plurality of opaque lines 241 but not the first group of conductor lines 410 and the second group of conductive lines 420.

The color filter layer 260 is disposed among the plurality of opaque lines 241 of the black matrix layer 240 and on the surface of the plurality of opaque lines 241.

The over coating layer 270 is disposed on the surface of the color filter layer 260.

The thin film transistor layer 300 is disposed at one side of the lower substrate 220 that faces the OLED layer 230. The thin film transistor layer 300 includes K gate lines and L source lines, wherein K and L are positive integers. The gate lines and source lines are well-known to those skilled in the art of display panel, and thus are not shown in the figures. Based on a display pixel signal and a display driving signal, a corresponding pixel driving circuit 301 is driven so as to proceed with display operation. The K gate lines and the L source lines are disposed at positions corresponding to the positions of the plurality of opaque lines 241.

In addition to the gate lines and source lines, the thin film transistor layer 300 further includes a plurality of pixel driving circuits 301. Based on a display pixel signal and a display driving signal, the thin film transistor layer 300 drives a corresponding pixel driving circuit 301 so as to proceed with display operation.

According to different designs of the pixel driving circuit 301, such as 2T1C being a pixel driving circuit formed with two thin film transistors and a storage capacitor, and 6T2C being a pixel driving circuit formed with six thin film transistors and two storage capacitors. The gate 3011 of at least one thin film transistor in the pixel driving circuit 301 is connected to a gate line (not shown). According to different designs of driving circuit, a source/drain 3013 of at least one thin film transistor in a control circuit is connected to a source line (not shown) and a source/drain 3015 of at least one thin film transistor in pixel driving circuit 301 is connected to a corresponding anode pixel electrode 291 of the anode layer 290.

The cathode layer 280 is disposed at one side of the upper substrate 210 facing the OLED layer 230 and between the upper substrate 210 and the OLED layer 230. The cathode layer 280 is formed with conductive metal material, preferably metal material with thickness being less than 50 nm. The metal material is selectively to be aluminum, silver, magnesium, calcium, potassium, lithium, indium, their alloy or combination of lithium fluoride, magnesium fluoride, lithium oxide and aluminum. Due to the thickness of the cathode layer 280 being less than 50 nm, the light generated by the OLED layer 230 can pass through it, so as to show images on the upper substrate 210. The cathode layer 280 is intact piece electrical connection, so that it can be used as a shielding. Moreover, the cathode layer 280 also receives the current coming from the anode pixel electrode 291.

The anode layer 290 is disposed at one side of the thin film transistor layer 300 facing the OLED layer 230. The anode layer 290 includes a plurality of anode pixel electrodes 291. Each of the anode pixel electrodes 291 is corresponding to one pixel driving transistor of the pixel driving circuit 301 of the thin film transistor layer 300. That is, each of the anode pixel electrodes 291 is connected to a source/drain 3015 of the pixel driving transistor of the corresponding pixel driving circuit 301, so as to form a pixel electrode of a specific color, for example a red pixel electrode, a green pixel electrode, a blue pixel electrode, or a white pixel electrode which is adopted in the present invention.

The OLED layer 230 includes a hole transporting layer 231, an emitting layer 233, and an electron transporting layer 235. The OLED layer 230 is preferably emitting white light, and using the color filter layer 260 to filter out and generate red, blue, green primary colors.

Figure 6:
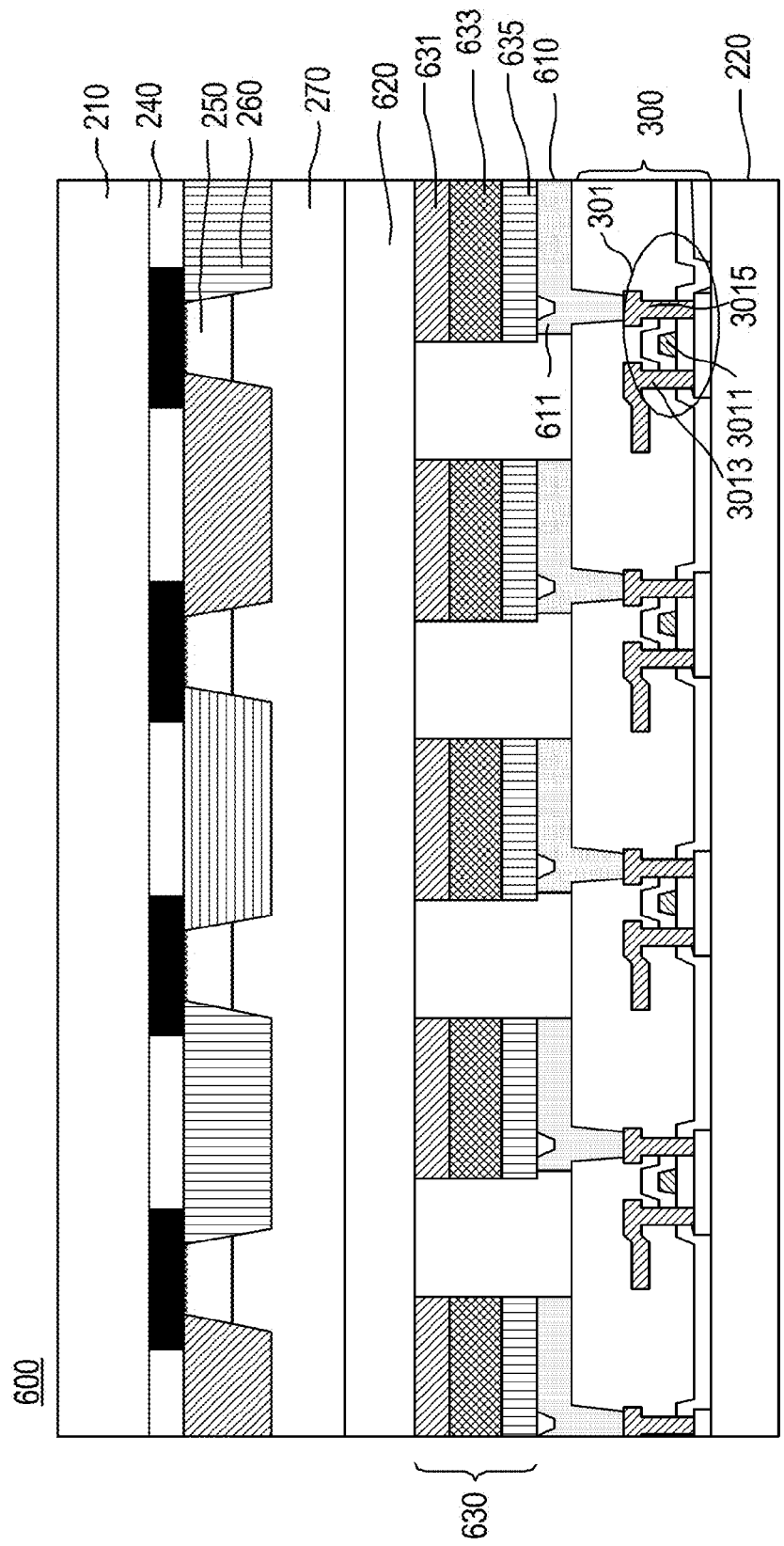
FIG. 6 shows an in-cell OLED touch display panel structure with metal layer for sensing in accordance with another embodiment of the present invention.

FIG. 6 is a schematic diagram of an in-cell OLED touch display panel structure with metal layer for sensing 600 in accordance with another embodiment of the present invention, which is similar to the in-cell OLED touch display panel structure of FIG. 2 except that the positions of the cathode layer 610 and the anode layer 620 are exchanged to each other. The cathode layer 610 includes a plurality of cathode pixel electrodes 611. Each of the cathode pixel electrodes 611 is corresponding to one pixel driving transistor of the pixel driving circuit 301 of the thin film transistor layer 300. That is, each of the cathode pixel electrodes 611 is connected to a source/drain 3015 of the pixel driving transistor of the corresponding pixel driving circuit 301, so as to form a pixel electrode of a specific color, for example a red pixel electrode, a green pixel electrode, a blue pixel electrode, or a white pixel electrode adopted in the present invention.

As shown in FIG. 6, the positions of the cathode layer 610 and the anode layer 620 are exchanged to each other. In order to match with the positions of cathode layer 610 and the anode layer 620, the positions of the hole transporting layer 631 and the electron transporting layer 635 are also exchanged to each other. The cathode layer 610 includes a plurality of cathode pixel electrodes 611. Each of the cathode pixel electrodes 611 is connected to a source/drain of the pixel driving transistor of the corresponding pixel driving circuit.

In view of the foregoing, it is known that the present invention is capable of forming a single-layered touch pattern on the sensing electrode layer 250, which has the advantage of not requiring to arrange a transparent sensing electrode layer on the upper glass substrate or lower glass substrate of the OLED touch display panel, thereby lowering the cost and decreasing the number of manufacturing steps. Further, in the prior art, the electrode pads made of ITO have an average light penetration rate of about 90%, while, in the present invention, the N mesh-like polygonal regions 41-1 to 41-N, and N conductive traces 42-1 to 42-N are disposed at positions corresponding to the positions of the opaque conductor lines 241 of the black matrix layer 240, so that the light penetration rate is not influenced. Therefore, the light penetration rate of the present invention is much better than that of the prior art. Accordingly, in comparison with the prior touch display panel, the in-cell OLED touch display panel structure in accordance with the present invention shall have a higher brightness.

Although the present invention has been explained in relation to its preferred embodiment, it is to be understood that many other possible modifications and variations can be made without departing from the spirit and scope of the invention as hereinafter claimed.

What is claimed is:

1. An in-cell OLED touch display panel structure with metal layer for sensing, comprising:
   an upper substrate;
   a lower substrate parallel to the upper substrate;
   an OLED layer configured between the upper substrate and the lower substrate;
   a black matrix layer disposed at one surface of the upper substrate facing the OLED layer, the black matrix layer being composed of a plurality of opaque lines;
   a sensing electrode layer disposed at one side of the black matrix layer facing the OLED layer, the sensing electrode layer being composed of a plurality of sensing conductor lines; and
   a thin film transistor layer disposed at one side of the lower substrate facing the OLED layer,
   wherein the plurality of sensing conductor lines are disposed at positions corresponding to those of the plurality of opaque lines of the black matrix;
   wherein the plurality of sensing conductor lines are divided into a first group of sensing conductor lines and a second group of sensing conductor lines, the first group of sensing conductor lines being formed to be N mesh-like polygonal regions as sensing electrodes, where N is a positive integer, the sensing conductor lines in any one of the mesh-like polygonal regions being electrically connected together while the sensing conductor lines in any two mesh-like polygonal regions are not electrically connected, so as to form a single-layered touch pattern on the sensing electrode layer;
   wherein the second group of sensing conductor lines is formed to be N conductive traces, each of the N conductive traces being electrically connected to a corresponding mesh-like polygonal region, while any two conductive traces are not electrically connected.

2. The in-cell OLED touch display panel structure with metal layer for sensing as claimed in claim 1, wherein the plurality of sensing conductor lines of the sensing electrode layer are arranged in a first direction and a second direction.

3. The in-cell OLED touch display panel structure with metal layer for sensing as claimed in claim 2, wherein the first direction is vertical to the second direction.

4. The in-cell OLED touch display panel structure with metal layer for sensing as claimed in claim 3, wherein each of the mesh-like polygonal regions is formed in a triangle, rectangle, square, rhombus, pentagon, hexagon, octagon, or round shape.

5. The in-cell OLED touch display panel structure with metal layer for sensing as claimed in claim 4, wherein the plurality of sensing conductor lines are made of conductive metal material or alloy material.

6. The in-cell OLED touch display panel structure with metal layer for sensing as claimed in claim 5, wherein the conductive metal material is selectively to be chromium, barium, aluminum, silver, copper, titanium, nickel, tantalum, cobalt, tungsten, magnesium, calcium, potassium, lithium, indium, and their alloy.

7. The in-cell OLED touch display panel structure with metal layer for sensing as claimed in claim 6, wherein the thin film transistor layer include K gate lines and L source lines for driving corresponding pixel driving transistor and pixel capacitor based on a display pixel signal and a display driving signal, so as to perform a display operation, where K and L are each a positive integer.

8. The in-cell OLED touch display panel structure with metal layer for sensing as claimed in claim 7, wherein the K gate lines and the L source lines are disposed at positions corresponding to those of the plurality of opaque lines of the black matrix layer.

9. The in-cell OLED touch display panel structure with metal layer for sensing as claimed in claim 8, further comprising:

a color filter layer disposed at one side of the black matrix layer and facing the OLED layer; and an over coating layer disposed on a surface of the color filter.

10. The in-cell OLED touch display panel structure with metal layer for sensing as claimed in claim 9, further comprising:

a cathode layer disposed at one side of the over coating layer facing the OLED layer; and an anode layer disposed at one side of the thin film transistor layer facing the OLED layer, the anode layer including a plurality of anode pixel electrodes, each of the anode pixel electrodes being connected to a source/drain of the pixel driving transistor of a corresponding pixel driving transistor.

11. The in-cell OLED touch display panel structure with metal layer for sensing as claimed in claim 9, further comprising:

a cathode layer disposed at one side of the thin film transistor layer facing the OLED layer, the cathode layer including a plurality of cathode pixel electrodes, each of the cathode pixel electrodes being connected to a source/drain of the pixel driving transistor of a corresponding pixel driving transistor; and an anode layer disposed at one side of the over coating layer facing the OLED layer.

* * * * *